United States Patent [19]

Ikeda et al.

[11] Patent Number: 5,592,130

[45] Date of Patent: *Jan. 7, 1997

[54] PIEZOELECTRIC OSCILLATOR INCLUDING A PIEZOELECTRIC RESONATOR WITH OUTER LEAD

[75] Inventors: Tatsuo Ikeda; Hiroyuki Ogiso; Kazushige Ichinose, all of Suwa, Japan

[73] Assignee: Seiko Epson Corporation, Tokyo, Japan

[ * ] Notice: The term of this patent shall not extend beyond the expiration date of Pat. No. 5,265,316.

[21] Appl. No.: 477,734

[22] Filed: Jun. 7, 1995

Related U.S. Application Data

[63] Continuation-in-part of Ser. No. 352,049, Dec. 5, 1994, Pat. No. 5,504,460, which is a continuation of Ser. No. 114,858, Sep. 2, 1993, Pat. No. 5,392,006, which is a division of Ser. No. 782,771, Oct. 17, 1991, Pat. No. 5,265,316, which is a continuation of Ser. No. 563,879, Aug. 6, 1990, abandoned, which is a continuation of Ser. No. 265,865, Oct. 6, 1988, abandoned.

[30] Foreign Application Priority Data

| Feb. 27, 1987 | [JP] | Japan | 62-28640 |
| Sep. 8, 1987 | [JP] | Japan | 62-224425 |
| Nov. 20, 1987 | [JP] | Japan | 62-293560 |
| Nov. 20, 1987 | [JP] | Japan | 62-293562 |

[51] Int. Cl.$^6$ .......................... H03B 5/36; H01L 41/053
[52] U.S. Cl. ................ 331/158; 331/68; 29/25.35; 361/813
[58] Field of Search ................... 331/68, 116 R, 331/116 FE, 108 C, 108 D, 158, 187; 310/311, 314, 340, 341, 344, 348, 351, 352, 353; 361/679, 813; 29/25.35; 257/734, 773, 777

[56] References Cited

U.S. PATENT DOCUMENTS

| 2,503,429 | 5/1950 | Ziegler | 310/344 |
| 2,577,576 | 12/1951 | Glickman | 310/344 |
| 2,656,473 | 10/1953 | Warner, Jr. | 310/353 |
| 3,221,189 | 11/1965 | Brandt et al. | 310/353 |
| 3,931,388 | 1/1976 | Hafner | 310/344 |
| 3,970,880 | 7/1976 | Deutschmann et al. | 310/353 |

(List continued on next page.)

FOREIGN PATENT DOCUMENTS

| 2817212 | 5/1979 | Germany . |
| 50-15492 | 2/1975 | Japan . |
| 52-63095 | 5/1977 | Japan . |
| 54-35870 | 3/1979 | Japan . |
| 54-43490 | 4/1979 | Japan . |
| 56-157827 | 11/1981 | Japan . |
| 57-112119 | 7/1982 | Japan . |
| 58-168317 | 10/1983 | Japan . |
| 59-36410 | 2/1984 | Japan . |
| 59-85123 | 5/1984 | Japan . |
| 59-78728 | 5/1984 | Japan . |
| 59-72032 | 5/1984 | Japan . |
| 60-30530 | 3/1985 | Japan . |
| 60-121324 | 8/1985 | Japan . |
| 61-19204 | 1/1986 | Japan . |
| 62-10911 | 1/1987 | Japan . |
| 62-169533 | 10/1987 | Japan . |
| 63-303505 | 12/1988 | Japan . |
| 64-35736 | 3/1989 | Japan . |
| 678471 | 9/1991 | Switzerland . |

*Primary Examiner*—David Mis
*Attorney, Agent, or Firm*—Stroock & Stroock & Lavan

[57] ABSTRACT

A resin mold type piezoelectric oscillator is provided comprising a piezoelectric oscillator having outer leads, a semiconductor integrated circuit for electrically oscillating the piezoelectric oscillator, and a lead frame formed substantially in a plane for mounting the piezoelectric oscillator and integrated circuit the lead frame having connection pads for connecting to the outer leads of the piezoelectric oscillator. The outer leads of the piezoelectric oscillator are bent at least twice in a plane substantially perpendicular to the lead frame so as to provide a clearance for crossing over inner leads of the lead frame.

10 Claims, 10 Drawing Sheets

U.S. PATENT DOCUMENTS

| | | | |
|---|---|---|---|
| 4,110,655 | 8/1978 | Hata | 310/344 |
| 4,266,156 | 5/1981 | Kizaki | 310/344 |
| 4,293,986 | 10/1981 | Kobayashi | 310/344 |
| 4,620,438 | 11/1986 | Howng | 310/338 |
| 4,703,656 | 11/1987 | Bhardwaj | 310/336 |
| 4,719,384 | 1/1988 | Hauden et al. | 310/344 |
| 4,746,831 | 5/1988 | Ichino | 310/327 |
| 4,797,787 | 1/1989 | Shimizu | 361/813 |
| 4,916,413 | 4/1990 | Nakayama et al. | 331/68 |
| 4,986,670 | 1/1991 | Uichiyama et al. | 374/117 |
| 5,008,776 | 4/1991 | Queyssac | 361/679 |
| 5,200,714 | 4/1993 | Hayashi | 331/66 |
| 5,229,640 | 7/1993 | Pak | 257/666 |
| 5,265,316 | 11/1993 | Ikeda et al. | 310/344 |
| 5,267,379 | 12/1993 | Pak | 29/29.35 |
| 5,327,104 | 7/1994 | Kikushima | 310/348 X |
| 5,392,006 | 2/1995 | Ikeda et al. | 331/158 |

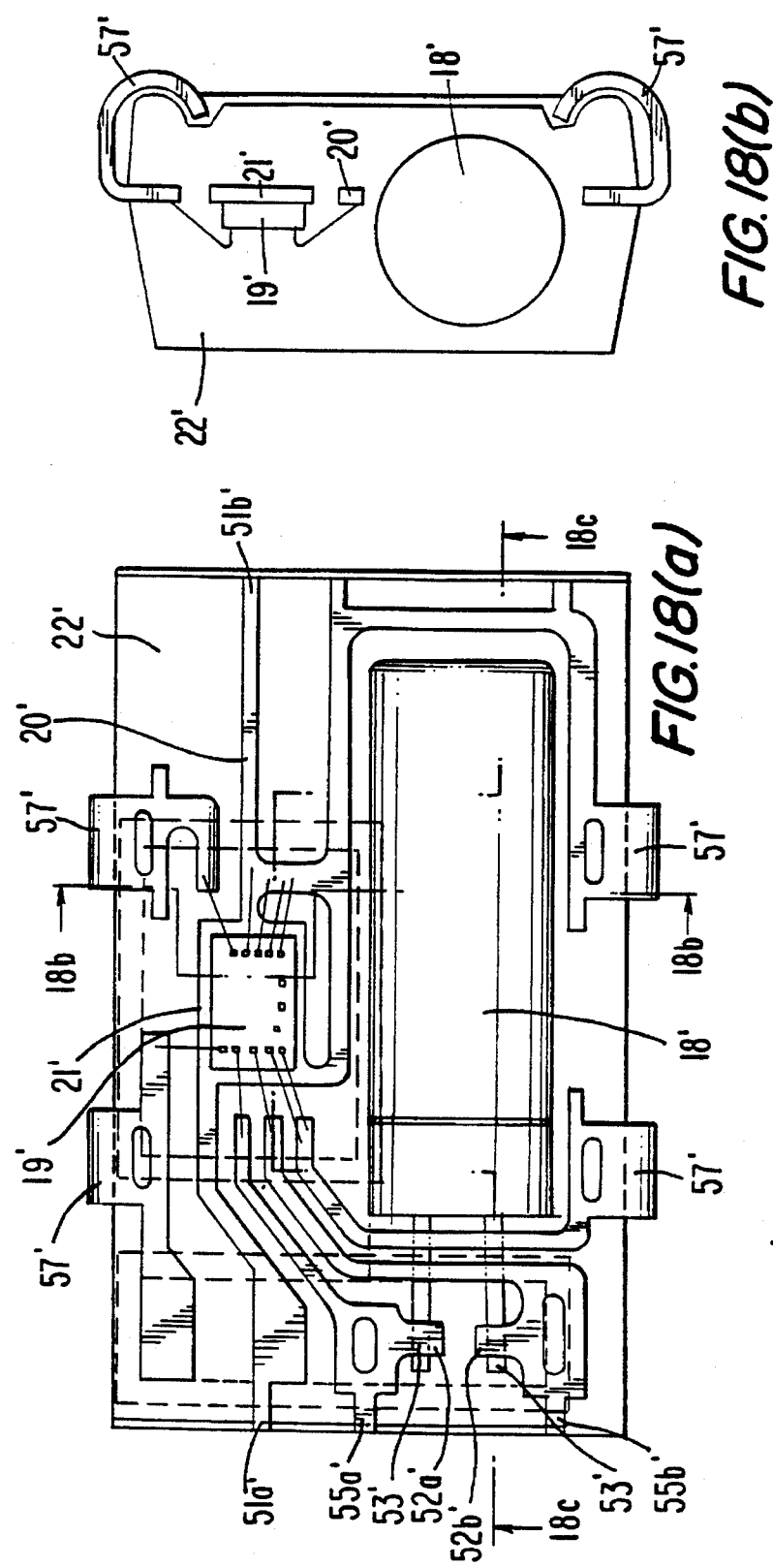

PIEZOELECTRIC OSCILLATOR INCLUDING A PIEZOELECTRIC RESONATOR WITH OUTER LEAD

CROSS-REFERENCE TO RELATED APPLICATIONS

This application is a continuation-in-part of application Ser. No. 08/352,049, filed Dec. 5, 1994, now U.S. Pat. No. 5,504,460, which is a continuation of application Ser. No. 08/114,858, filed Sep. 2, 1993, now U.S. Pat. No. 5,392,006, which is a division of application Ser. No. 07/782,771, filed Oct. 17, 1991, now U.S. Pat. No. 5,265,316, which is a continuation of application Ser. No. 07/563,879, filed Aug. 6, 1990 (abandoned), which itself is a continuation of application Ser. No. 07/265,865, filed Oct. 6, 1988 (abandoned).

BACKGROUND OF THE INVENTION

The present invention relates to a pressure seal type piezoelectric resonator, also referred to herein as an oscillator, wherein a piece of quartz acting as a vibrator, also referred to herein as an oscillator, is sealed in a case by use of a press-fitting case system. The present invention also relates to a resin mold type piezoelectric oscillator wherein the pressure seal type piezoelectric oscillator is packaged by resin, a case-inserted type piezoelectric resonator (oscillator) having a separate case with the pressure seal type piezoelectric oscillator inserted therein and a piezoelectric resonating (oscillating) apparatus wherein the pressure seal type piezoelectric oscillator and an Integrated Circuit (IC) having an oscillating circuit are sealed by resin. As used herein, the term oscillator will also be used to refer to a resonator or vibrator.

A conventional piezoelectric oscillator has been formed by use of a fastening method by adhesive agent 101 or a fastening method by solder having the ratio of Sn to Pb, 6:4 or 9:1, for fastening a piece of piezoelectric oscillator. Further, a pressure seal method has been employed in which the case is coated with solder 102 or gold by plating, and a welding method such as a cold pressure welding method has also been employed for sealing.

Furthermore, a conventional resin mold piezoelectric oscillator is constructed as depicted in FIG. 16. This piezoelectric oscillator is an integrally formed oscillator in which a piece of piezoelectric oscillator 103 is adhered to inner lead 105 of stem 104 by an adhesive agent such as polyimide series one, stem 104 and case 106 are sealed by gold as shielding material 107 and the pressure seal type piezoelectric oscillator and the lead frame are adhered by welding.

A conventional piezoelectric oscillator has been constructed as depicted in FIG. 17, wherein the above-described pressure seal type piezoelectric oscillator 109, semiconductor 110 which electrically oscillates pressure seal type piezoelectric oscillator 109 and the lead frame which electrically connects pressure seal type piezoelectric oscillator 109 with semiconductor 110 have been molded by resin 111.

However, when the above-described prior art is employed as SMT (Surface Mount Technology) parts, the temperature of the parts rises up to 220°–260° C. when they are packaged on the substrate and the solder containing 40% and less of lead are melted. In addition to this fundamental disadvantage, deterioration of the properties, shift in frequency and in equivalent resistance value of pressure seal type piezoelectric oscillator by gas containing organic components ejected from the soldering are caused.

It is, therefore, an object of the invention to solve the above-described disadvantages and to provide an improved pressure seal type piezoelectric oscillator, resin mold type piezoelectric oscillator and piezoelectric oscillating apparatus, each having heat resistance applicable for SMT packaging at 260° C. and higher and having excellent properties with respect to high temperature frequency aging.

SUMMARY OF THE INVENTION

The present invention is directed to a pressure seal type piezoelectric oscillator wherein a case and a stem are coated with solder containing 90% and higher of lead therein, a piece of piezoelectric oscillator is adhered by melting the solder coated on an inner lead of the stem and the case and the stem are hermetically sealed by press-fitting method with the solder as a shielding material.

The present invention is directed to a resin mold type piezoelectric oscillator, wherein the case and the stem are coated with solder containing 90% and higher of lead, a piece of piezoelectric oscillator is adhered by melting the solder coated on the inner lead of the stem and an outer lead and a lead frame of the pressure seal type piezoelectric oscillator wherein the case and the stem are hermetically sealed by a pressure seal method with the solder as a shielding material are adhered to each other, and such pressure seal type piezoelectric oscillator and the lead frame are integrally molded by resin.

Further, according to the present invention, the case and the stem are coated with solder containing 90% and higher of lead, a piece of piezoelectric oscillator is adhered by melting the solder coated on the inner lead of the stem and the stem are hermetically sealed by a press-fitting method with the solder as a shielding material.

The present invention is directed to a case-inserted type piezoelectric oscillator having a rectangular case having a thickness within the range from 0.05 to 1.5 mm and whose cross-section has one or more corners at the periphery of cylindrical pressure seal type piezoelectric oscillator excepting the lead portion.

Furthermore, the present invention is directed to a pressure seal type piezoelectric oscillating apparatus wherein the case and the stem are coated with the solder containing 90% and higher of lead, a piece of piezoelectric oscillator is adhered by melting the solder coated on the inner lead of the stem. The present invention is also directed to a pressure seal type piezoelectric oscillator wherein the case and the stem are hermetically sealed by a press-fitting method with the solder as a shielding material, and a semiconductor (IC) for electrically oscillating the pressure seal type piezoelectric oscillator and the lead frame are molded by resin.

The present invention is also directed to a resin mold type piezoelectric oscillator including a piezoelectric oscillator having outer leads, a semiconductor integrated circuit for electrically oscillating the piezoelectric oscillator, and a lead frame formed substantially in a plane with connection pads on which the piezoelectric oscillator and semiconductor integrated circuit are mounted, the piezoelectric oscillator being electrically connected to the connection pads. The outer leads of the piezoelectric oscillator are each bent at least twice in a plane substantially perpendicular to the plane of the lead frame, the plane intersecting the connection pad to which the outer lead is connected. The bending provides clearance for the outer leads of the piezoelectric oscillator to cross one or more inner leads of the lead frame. Further, the distance between the outer leads of the piezoelectric oscillator distal from a root of the case of the piezoelectric oscillator is wider than the distance between the outer leads proximate the root to allow the outer leads of the piezoelectric oscillator to be securely connected and fixed to the connection pads, thereby preventing deformation of the position of the piezoelectric oscillator during molding.

The present invention is further directed to a resin mold type piezoelectric oscillator including a piezoelectric oscillator having outer leads, a semiconductor integrated circuit for electrically oscillating the piezoelectric oscillator, and a lead frame formed substantially in a plane having a tab portion supported by suspension pin leads, connection pads supported by support leads and lead frame outer leads which project beyond the piezoelectric oscillator package. The piezoelectric oscillator and semiconductor integrated circuit are mounted on and electrically connected to the lead frame, the outer leads of the piezoelectric oscillator being electrically connected to the connection pads. The distance between a suspension pin lead and a support lead as well as the distance between the support leads themselves are each greater than or equal to the distance between adjacent lead frame outer leads.

Accordingly, it is an object of the invention to provide an improved resin mold type piezoelectric oscillator.

Another object of the invention is to ensure a clearance between inner leads of a lead frame and outer leads of a mounted resin mold piezoelectric oscillator to prevent short circuits or other malfunctions.

It is yet another object of the invention to prevent concentration of stress on the outer leads of the mounted resin mold type piezoelectric oscillator.

A further object of the invention is to provide a compact piezoelectric oscillator.

Still other objects and advantages of the invention will in part be obvious and will in part be apparent from the specification.

The invention accordingly comprises the features of construction, combinations of elements and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 18(a) is a top plan view of a resin mold type piezoelectric oscillator of the present invention;

FIG. 18(b) is a sectional view of a resin mold type piezoelectric oscillator of the present invention taken along the line 18b—18b of FIG. 18(a); and FIG. 18(c) is a sectional view of a resin mold type piezoelectric oscillator of the present invention taken along the line 18c—18c of FIG. 18(a).

DESCRIPTION OF THE PREFERRED EMBODIMENTS

Figure 1:
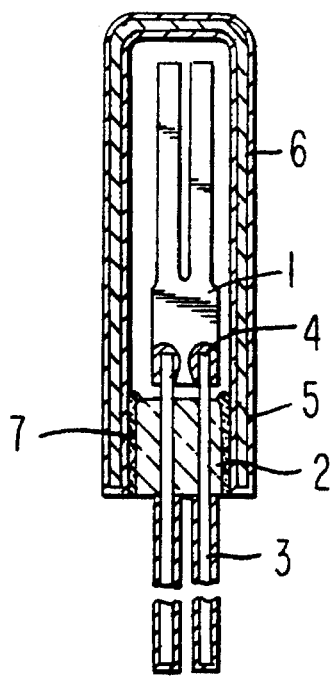
FIG. 1 is a structural view of a pressure seal type piezoelectric oscillator constructed in accordance with the invention.
Figure 2:
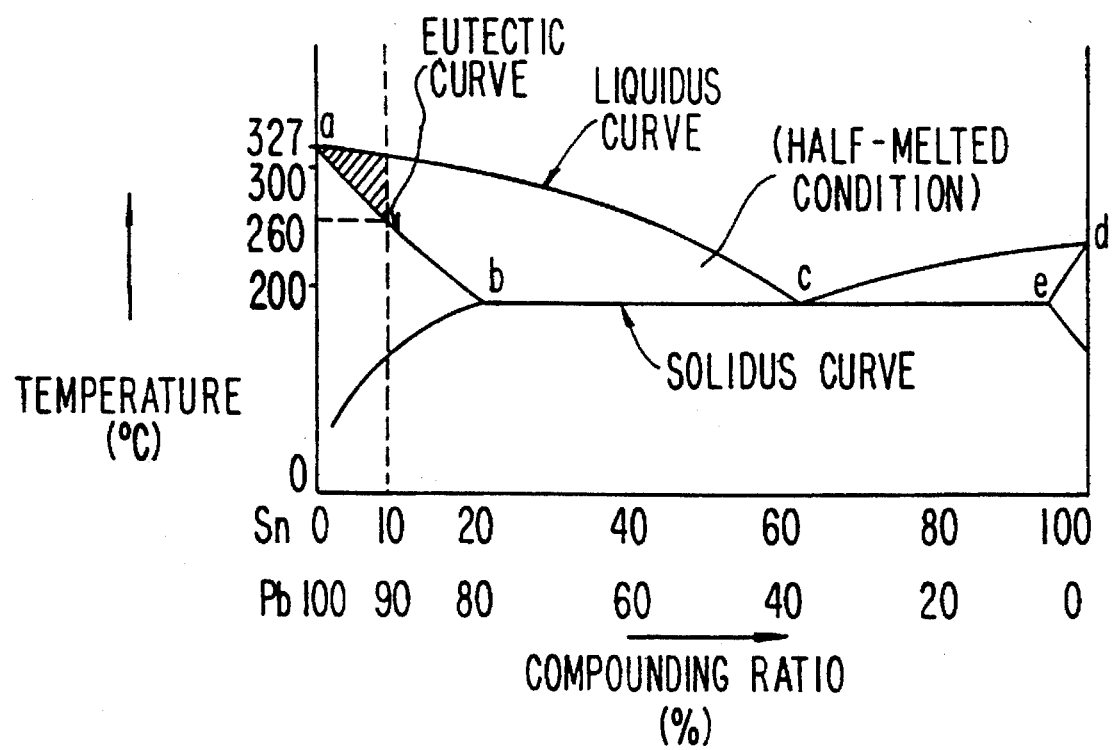
FIG. 2 is a graph showing condition of a solder.
Figure 3:
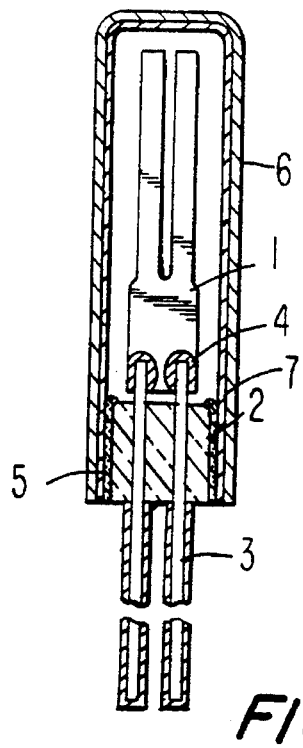
FIG. 3 is a structural view of a pressure seal type piezoelectric oscillator constructed in accordance with an alternate embodiment of the invention.
Figure 4:
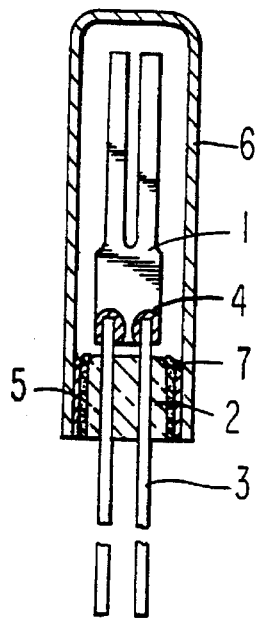
FIG. 4 is a structural view of the pressure seal type piezoelectric oscillator constructed in accordance with another embodiment of the invention.

FIG. 1 shows a structural view of a quartz resonator, also referred to herein as an oscillator, as an embodiment of a pressure seal type piezoelectric oscillator of the present invention. A tuning fork-shaped piece of quartz oscillator 1 which is made of quartz plate by photolithography is adhered to lead 3 of stem 2 wherein lead 3 is sealed to metallic ring 7 with glass, by high-temperature solder 4 provided thereon by plating the solder having a melting point of 260° C. and higher and a ratio Sn to Pb of about 1:9. FIG. 2 is a graph showing conditions of solder. Further, a quartz oscillator is completed when case 6 coated with high-temperature solder 5 is hermetically sealed by a press-fitting method. Since Sn is cracked or broken at a very low temperature at times, a solder with a large amount of Pb has good heat resistance and is stable at very low temperature. High heat resistance and operation efficiency are required for the solder so that a high-temperature solder containing not only Sn and Pb but also with a third metal such as Ag can be applicable. Generally, a rotating type plating method is employed for plating the pressure seal type stem and case with the solder so that the solder is adhered to the entire metallic portion of stem 2 and case 6. Then, organic components are ejected as gas from the plated solder. This results in a deterioration in properties, such as an adhesion of the gas to a piece of the oscillator or a lowering of the degree of vacuum. The deterioration in properties is also caused when not the entire metallic portion but only the inner periphery of case 6 is plated with the solder as shown in FIG. 3. Therefore, partial plating, such as that high-temperature solder 4 is used at the fastening portion of quartz oscillator piece 1 with lead 3 and high temperature solder 5 at the sealing portion of stem 2 with case 6 is more desirable. If quartz oscillator piece 1 is hermetically sealed at high temperature (room temperature to 260° C.) in case that the entire metallic portion of the case and of the stem are plated with the solder, the equivalent resistance value is extremely increased (100% and higher, on occasion) and aging in frequency is caused considerably, which sometimes stops the oscillating. Accordingly, before and/or while stem 2 is hermetically press-sealed into case 6, the gas should be ejected outward by heat baking. Desirable temperature for such baking is indicated in FIG. 2 as the temperature within the portion marked with slant lines surrounded by eutectic curve ab, liquidus curve ac and a line indicating 90% of lead content. Organic components can be ejected thoroughly by heat baking in this condition, thereby limiting the increase in the equivalent resistance value within several percent.

Further, when a press-fitting method is applied, the high-temperature solder is plated at least on the side of the case of the sealing portion so that airtightness can be maintained. The metallic ring of the stem can also be plated with Ni or Cu.

The above-described structure can be achieved with the manufacturing technique similar to the conventional one while being inexpensive to manufacture with low cost materials, which achieves mass production and miniature size. A large burden in the process in which quartz oscillator piece is adhered can be lightened by applying the solder melting method, which results in an easier production. Further, the production also becomes easier with low cost materials by applying the press-fitting method as the sealing method.

As the conventional quartz oscillator has a low heat-resistance property, the mounting method similar to one applied for the SMT which has taken rapid strides these days has not been applied. However, the pressure seal type quartz oscillator of the present invention can be mounted simultaneously with the SMT parts. The quartz oscillator can be confirmed that no deterioration of properties thereof is caused at 260° C. of mounting temperature and at 150° C. of preservation temperature.

This embodiment is described employing a tuning fork-shaped quartz oscillator piece, and other piezoelectric oscillator piece having different configuration and material such as a rectangular AT cut quartz oscillator piece or tantalic acid lithium oscillator piece are confirmed that no deterioration of heat-resistance property is caused.

Figure 5:
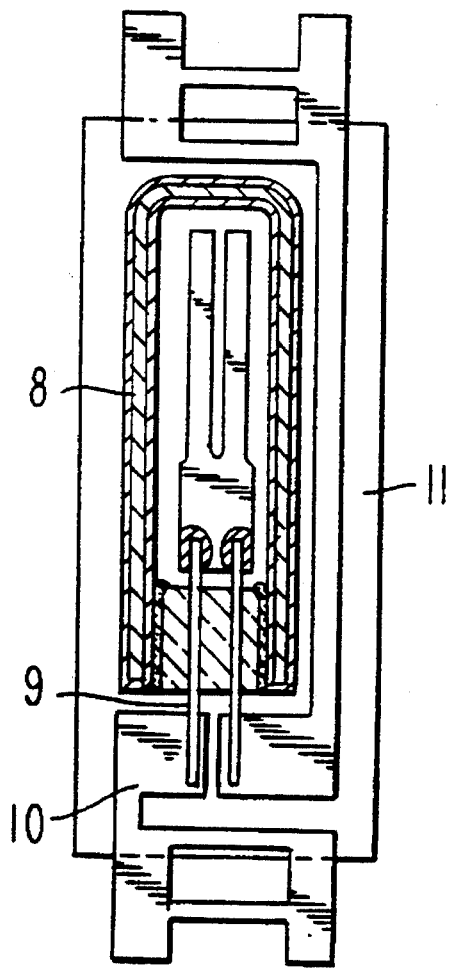
FIG. 5 is a structural view of a resin mold type piezoelectric oscillator constructed in accordance with another embodiment of the invention.
Figure 6:
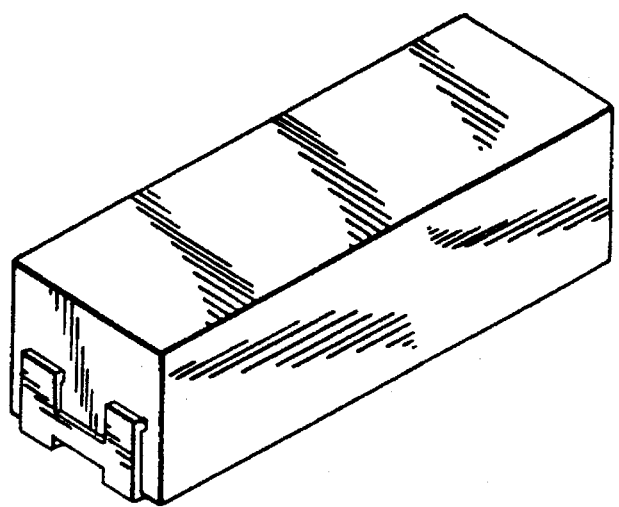
FIG. 6 is a perspective view of a resin mold type piezoelectric oscillator of the invention.
Figure 7:
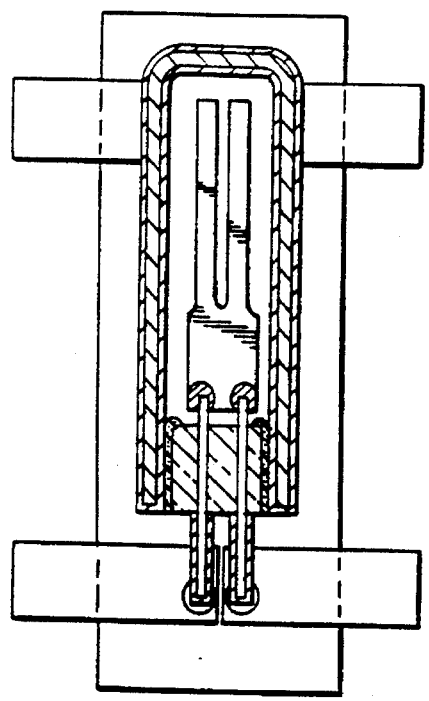
FIG. 7 is a structural view of a resin mold type piezoelectric oscillator constructed in accordance with an embodiment of the invention.
Figure 8:
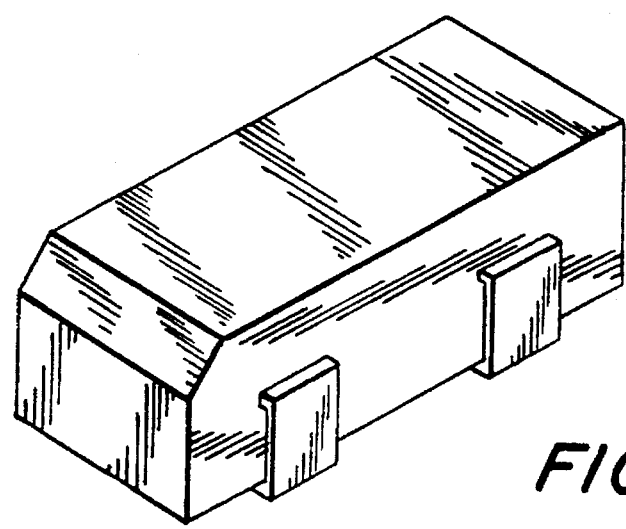
FIG. 8 is a perspective view of a resin mold type piezoelectric oscillator constructed in accordance with an embodiment of the invention.

The resin mold type piezoelectric oscillator is adhered to lead frame 10 by a method such as that the solder of outer lead 9 of pressure seal type piezoelectric oscillator 8 is melted, as shown in FIG. 5. The welding is more sufficient for solid adhesion. The resin mold type pressure seal piezoelectric oscillator can be completed by integral molding of these members with epoxy or phenol series resin 11. FIG. 6 is a perspective view showing a structure wherein the lead frame is brought out to the end portion. In this structure, the lead frame is bent inside toward the base. This is called a J-bend. The lead frame can be bent outside, which is called a gullwing configuration. Further, the lead frame can be brought out to the side face as shown in FIG. 7. FIG. 8 is a perspective view thereof. It is better to perform marking, such as to round off the corners of the periphery of resin, in order to distinguish the lead which is to be conducted for operating the piezoelectric oscillator from other leads.

Figure 9:
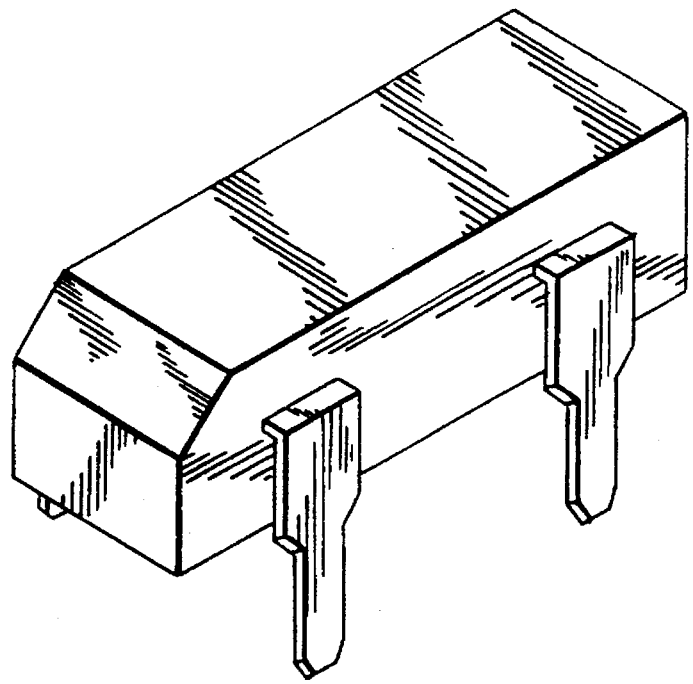
FIG. 9 is a perspective view of a resin mold type piezoelectric oscillator constructed in accordance with another embodiment of the invention.

FIG. 9 is a perspective view of a resin mold type piezoelectric oscillator constructed in accordance with an alternate embodiment of the invention. The above-described embodiment relates to the structure of a surface mounting type, but the lead-inserted type is also applicable.

Figure 10:
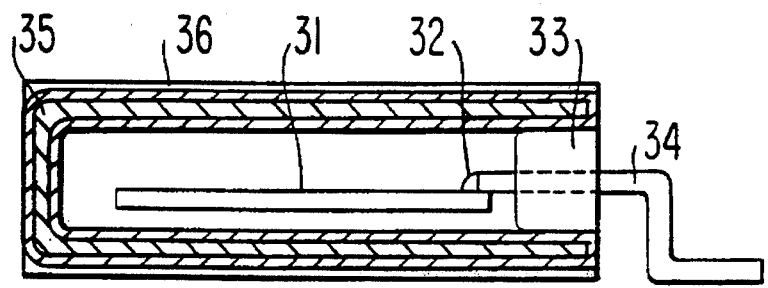
FIG. 10 is a structural view of a case-inserted type piezoelectric oscillator of the invention.
Figure 11A:
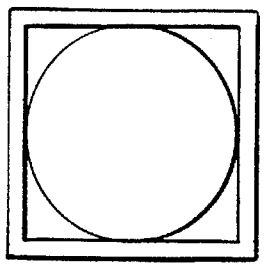
FIG. 11(a) is a cross-sectional view of a case-inserted type piezoelectric oscillator of the invention.
Figure 11B:
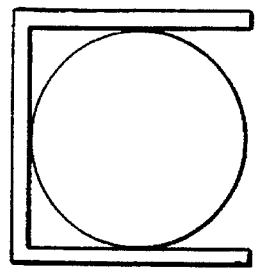
FIG. 11(b) is a cross-sectional view of a case-inserted type piezoelectric oscillator constructed in accordance with another embodiment of the invention.
Figure 11C:
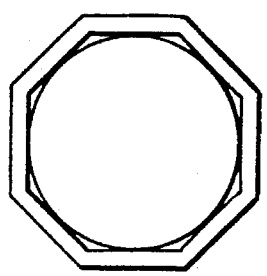
FIG. 11(c) is a cross-sectional view of a case-inserted type piezoelectric oscillator constructed in accordance with another embodiment of the invention.

According to a case-inserted type piezoelectric oscillator, rectangular case 36 is attached to the periphery of the above-described pressure seal type piezoelectric oscillator and lead 34 is bent, as shown in FIG. 10. Rectangular case 36, if it is made of metal, has a thickness within the range from 0.05 to 1.5 mm, whereby it can be molded by a method such as pressing easily. Further, rectangular case 36 can also be made of resin. It is fixed by welding, adhesive agent or fitting. The configuration of the rectangular case can be a polygon having three or eight faces as well as one having four faces, as shown in FIG. 11. The rectangular case made of metal can also be applied as an earth.

Figure 12:
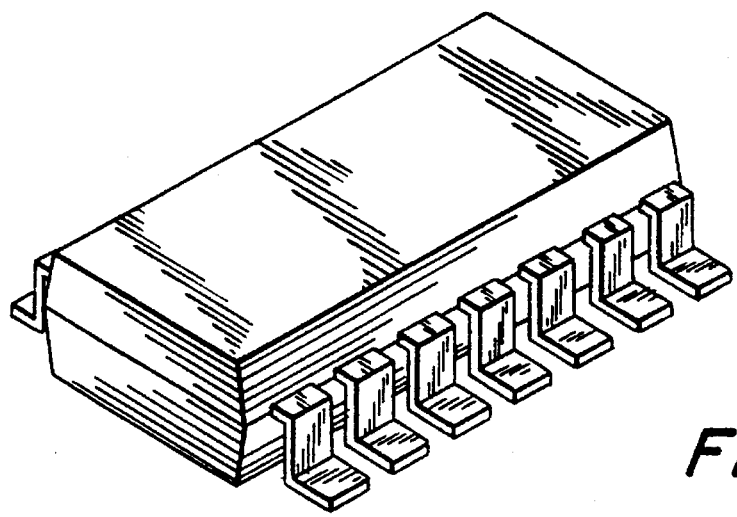
FIG. 12 is a perspective view of a piezoelectric oscillator in use of a pressure seal type piezoelectric oscillator of the invention.
Figure 13A:
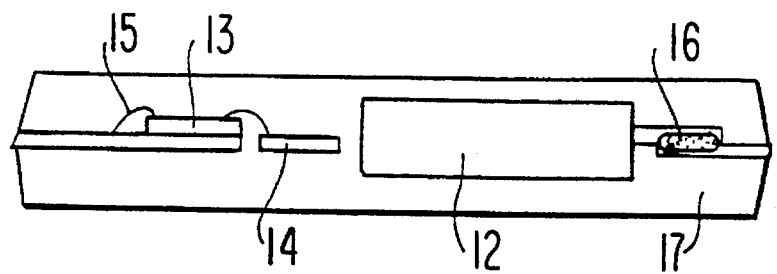
FIG. 13(a) is a cross-sectional view of a piezoelectric oscillator in use of a pressure seal type piezoelectric oscillator of the invention.
Figure 13B:
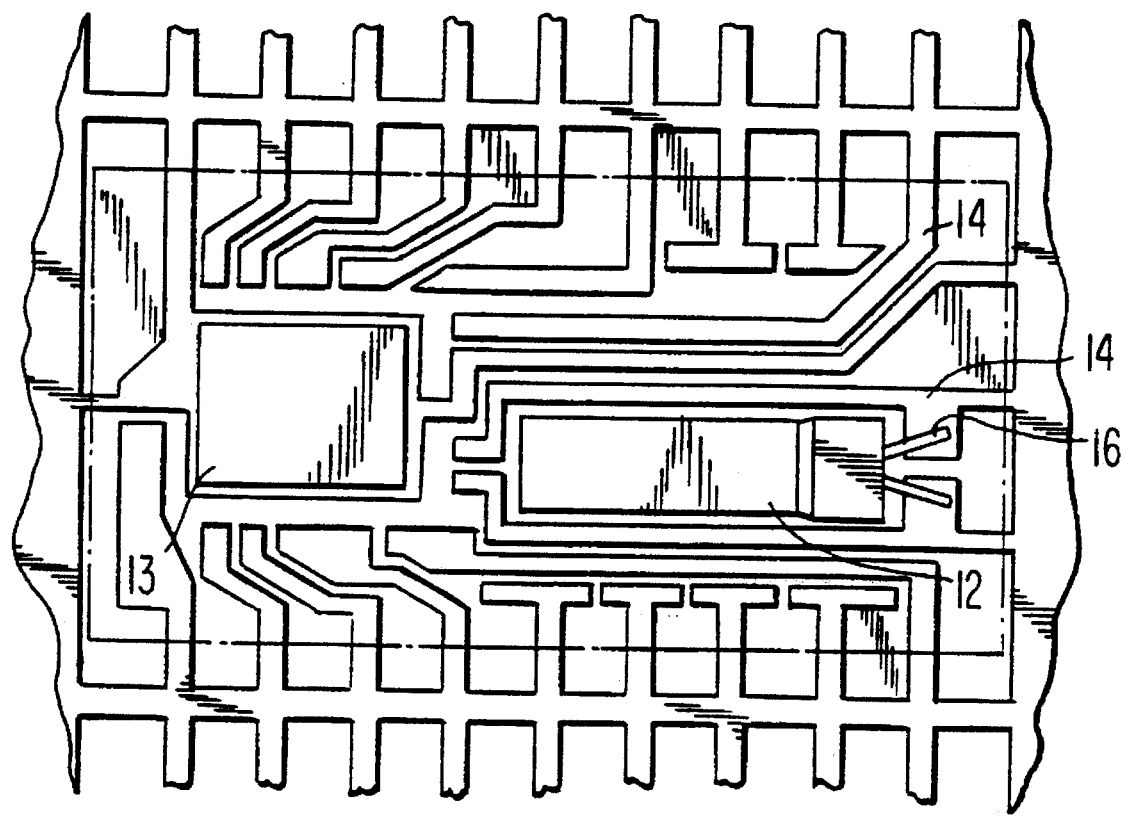
FIG. 13(b) is a main plan view showing a piezoelectric oscillator constructed in use of a pressure seal type piezoelectric oscillator of the invention.

Next, according to the first embodiment of a piezoelectric oscillator in use of the pressure seal type piezoelectric oscillator of the invention as shown in FIGS. 12 and 13, pressure seal type piezoelectric oscillator 12 and semiconductor 13 for electrically oscillating oscillator 12 are arranged on the same plane, and they are electrically connected to form an oscillation circuit by melting the wire bonding of metallic fine wire 15 and the solder of outer lead 16 of pressure seal type piezoelectric oscillator 12 through lead frame 14. The piezoelectric oscillator further comprises resin 17 including pressure seal type piezoelectric oscillator 12, semiconductor 13, lead frame 14 and metallic fine wire 15. Since lead frame 14 is not rigid enough and the wire can be cut down on occasion when pressure seal type piezoelectric oscillator 12 is adhered thereto, it is desirable that lead 14 is arranged on the opposite side to the location of semiconductor 13 and near outer frame 42 of the lead frame.

Figure 14A:
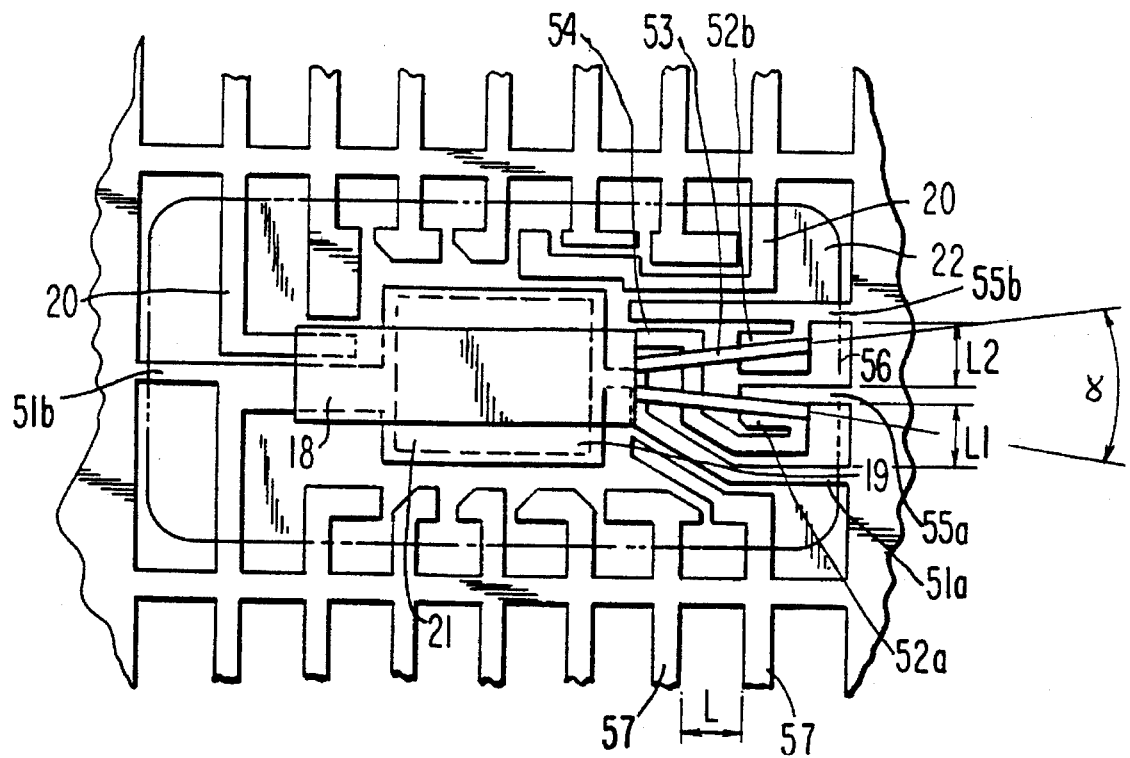
FIG. 14(a) is a main plan view of a piezoelectric oscillator constructed in accordance with the invention.
Figure 14B:
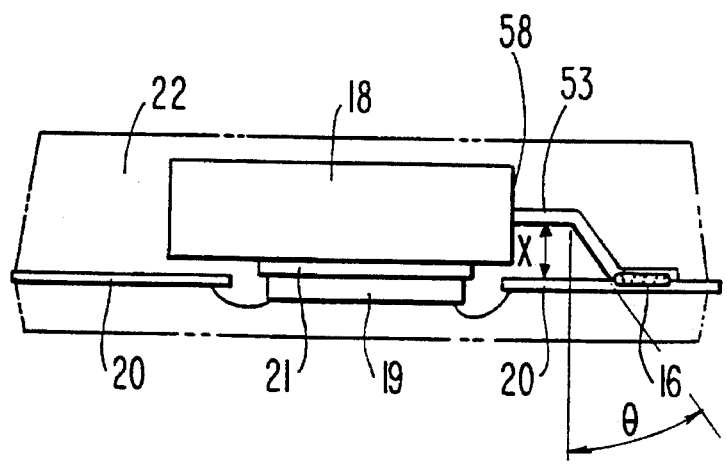
FIG. 14(b) is a main cross-sectional view of a piezoelectric oscillator of the invention.
Figure 15:
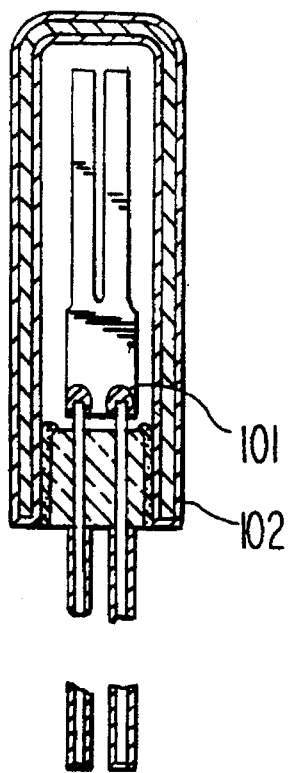
FIG. 15 is a cross-sectional view of a conventional pressure seal type piezoelectric oscillator.
Figure 16:
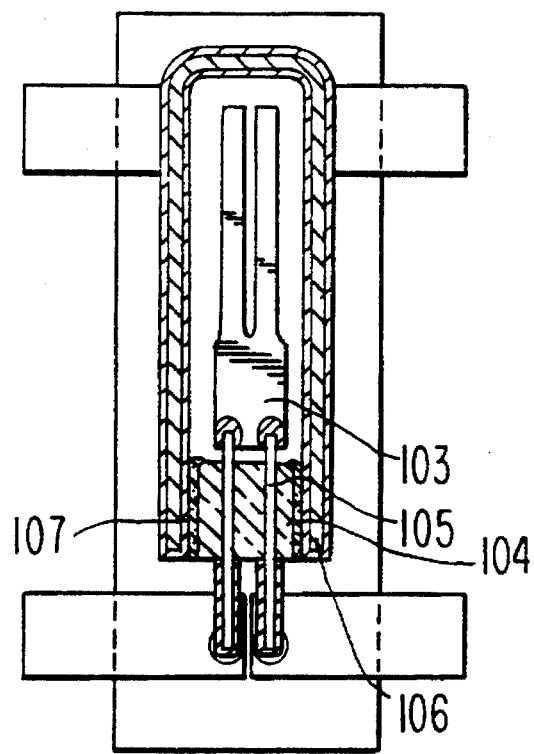
FIG. 16 is a structural view of a conventional resin mold type piezoelectric oscillator.
Figure 17:
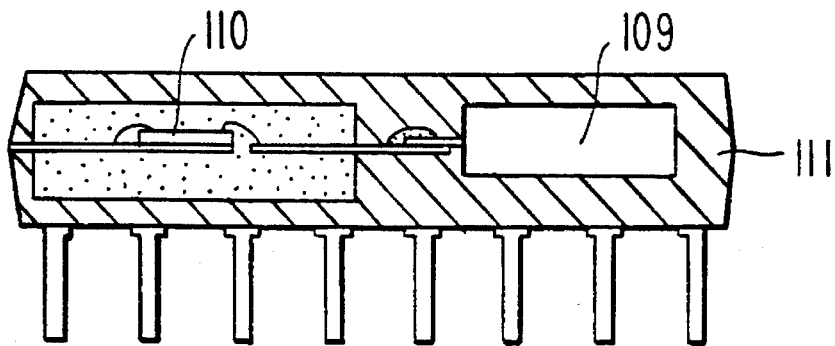
FIG. 17 is a main cross-sectional view of a conventional piezoelectric oscillator.

The second embodiment of the piezoelectric oscillator is described referring to FIGS. 14(a) and 14(b), in which pressure seal type piezoelectric oscillator 18 and semiconductor 19 which electrically oscillates oscillator 18 are disposed on the upper surface and the lower surface of lead frame 20 respectively. Tab 21 of lead frame 20 to which semiconductor 19 is adhered is pushed out toward the side of piezoelectric oscillator 18 to make a parallel contact with pressure seal type piezoelectric oscillator 18, thereby maintaining a clearance for electric insulation between pressure seal type piezoelectric oscillator 18 and lead frame 20. This prevents not only the electric conduction between piezoelectric oscillator 18 and lead frame 20 but also short circuit between leads of lead frames 20. According to this structure, the area is a half of that of the case wherein pressure seal type piezoelectric oscillator and the semiconductor are arranged on the plane and the thickness is a sum of the minimum thicknesses of each part.

In the end, the entire body is molded by heat resistant resin 22 including piezoelectric oscillator 18, semiconductor 19 and lead frames 20 and 21.

According to the piezoelectric oscillator described in the above embodiment, the portion to which the piece of oscillator is attached by the solder, the bonding portion between the case and the stem and that between the lead of pressure seal type piezoelectric oscillator and the lead frame are so constructed to have 260° C. and higher heat resistance, including the other parts.

The configuration of the entire body is the form of lead frame, which is called gullwing, for a flat package corresponding to SMT as shown in FIG. 12. It can be applied to a form of lead-inserted as an insertion part such as DIP (dual in-line package) type.

It can further be applied to a form of J-bend lead frame for a flat package embodiment.

Another embodiment of the present invention is described with reference to FIG. 14(a). A tab portion 21 is supported within lead frame 20 by suspension pin leads 51a and 51b. A semiconductor integrated circuit 19 is mounted on tab portion 21 of lead frame 20. A piezoelectric oscillator 18 is mounted on tab portion 21 and is fixed in position by connecting outer leads 53 thereof to connection pads 52a and 52b of lead frame 20.

As shown in FIG. 14(b), the outer leads 53 of the piezoelectric oscillator 18 are each bent twice as they extend between root 58 of piezoelectric oscillator 18 and connection pads 52a and 52b. Each outer lead 53 bends in a plane substantially perpendicular to the plane of lead frame 20, the plane intersecting the respective connection portions of the connection pads 52a and 52b. The bending angle 8 of the outer leads 53 is set within the range of about 10° to about 45°, is preferably set within the range of about 10° to about 40°, and in an exemplary embodiment is set to about 35°. This prevents concentration of stress on the bent portions of the outer leads, and enables a bending die for bending the outer leads to be produced at a low cost because of the simplicity of the bending die.

The outer leads 53 cross an inner lead 54 of lead frame 20 which extends from the connection pad 52a to the tab portion 21. The clearance X in height produced by bending the outer leads 53 may be an amount sufficient to ensure the clearance with the inner lead 54. X is preferably set to at least the thickness of the lead frame 20, and in an exemplary embodiment is set to X=0.85 mm or more.

Since the outer leads 53 are bent twice, it is possible to ensure a clearance between the inner lead 54 and outer leads 53 preventing the occurrence of short circuits and the like. Further, since outer leads 53 cross the inner lead 54, a compact and small piezoelectric oscillator can be provided.

The distance between outer leads 53 at an end distal from the root 58 of piezoelectric oscillator 18 is wider than the distance between the ends of the outer leads 53 proximate root 58. As a result, outer leads 53 form an angle α. α is preferably within the range of about 5° to about 15°, and in an exemplary embodiment α equals about 10°. This permits outer leads 53 of piezoelectric oscillator 18 to be reliably connected and fixed to connection pads 52a and 52b. Since the piezoelectric oscillator can be securely fixed, it is possible to prevent deformation (inclination of the piezoelectric oscillator and the like) of the piezoelectric oscillator in the direction of the plane of the lead frame during molding. This widening of the distance between the ends of outer leads 53 distal from root 58 can be performed simultaneously with the bending of outer leads 53 described above.

Support leads 55a and 55b support connection pads 52a and 52b. Suspension pin lead 51a and support leads 55a, 55b are arranged on a side 56 of a resin mold piezoelectric oscillator package 22. The suspension pin lead 51a and the support leads 55a and 55b can thus be cut at the same time that the resin mold piezoelectric oscillator package 22 is cut off from the lead frame 20 after packaging.

A distance L1 corresponding to the distance between the suspension pin lead 51a and the support lead 55a and a distance L2 corresponding to the distance between support leads 55a and 55b are each set to be equal to or greater than the distance L corresponding to a distance between adjacent lead frame outer leads 57 of the resin mold piezoelectric oscillator package 22. In a preferred embodiment, L1 and L2=0.92 mm and L=0.92 mm. Such spacing between the suspension pin lead 51a and the support lead 55a and between the support pin leads 55a and 55b prevents short circuits between the respective leads due to dew drops or other moisture. Such spacing further prevents cracking in the package during cutting because the volume of resin between the respective leads is increased by ensuring the stated clearance between the leads, thereby increasing the bonding strength of the resin.

By providing a resin mold piezoelectric oscillator in which the outer leads of the piezoelectric oscillator are bent twice, a clearance is ensured between the inner leads of the lead frame and the outer leads of the piezoelectric oscillator preventing the occurrence of short circuits and the like. Because the bending angle of the outer leads is set between 10° to 45°, bending of the outer leads of the piezoelectric oscillator is facilitated. Additionally, by using such angles it is possible to prevent concentration of stress on the bent portions of the outer leads, and to produce bending dies for bending the outer leads at a low cost because of the simplicity of the bending dye. By providing a configuration in which the outer leads cross the inner leads, a compact and small piezoelectric oscillator is provided.

Because the distance between the outer leads at an end distal from the root of the piezoelectric oscillator is wider than the distance between the ends of the outer leads proximate the root, thus forming an angle of about 10°, the piezoelectric oscillator can securely be connected and fixed by the connection pads of the lead frame. Because the piezoelectric oscillator can be securely fixed, it is possible to prevent deformation of the piezoelectric oscillator in the direction of the plane of the lead frame during resin molding. Furthermore, the widening of the distance between the ends of the outer leads distal from the root can be performed at the same time as the bending of the outer leads.

By providing the suspension pin leads and support leads on the same side of the oscillator, it is possible to cut these leads at the same time piezoelectric oscillator is cut from the lead frame. Furthermore, by providing clearances between the suspension pin and the support leads, short circuits are prevented which would arise due to moisture and dew drops, and cracking may be prevented in the resin package during cutting because the volume of resin between the respective leads is increased by ensuring the spacing between the respective leads, thereby increasing bonding strength.

According to the piezoelectric oscillator described in the above embodiment, the case and the stem are coated with the solder containing 90% and higher of lead, the piece of piezoelectric oscillator is adhered by melting the solder coated on the inner lead of the stem and the case and the stem are hermetically sealed with the solder as a shielding material by the pressure seal method. Therefore, the piezoelectric oscillator can be adhered directly by the solder coated on the lead without using an adhesive agent and the case and the stem can be pressure sealed directly by the solder coated thereon, which renders a pressure seal type piezoelectric oscillator having sufficient heat resistance and being inexpensive for materials thereof and production. Further, since the case and the stem to which the piece of piezoelectric oscillator is adhered by melting the solder are hermetically sealed by the pressure seal method at the temperature wherein the solder is melted, the piezoelectric oscillator having low equivalent resistance value, improved temperature aging properties and reliability can be obtained.

Further, according to the resin mold type piezoelectric oscillator of the present invention, the case and the stem are coated with the solder containing 90% and higher of lead, the piece of piezoelectric oscillator is adhered by melting the solder coated on the inner lead of the stem, and the case and the stem are hermetically sealed with the solder as a shielding material by the press-fitting method. Furthermore, the outer lead of such pressure seal type piezoelectric oscillator is adhered to the lead frame and the pressure seal type piezoelectric oscillator and the lead frame are integrally molded by resin. Hence, an inexpensive piezoelectric oscillator having high quality and sufficient heat resistance, which is further convenient to operate for automatic mounting and the like, can be obtained.

Furthermore, according to the case-inserted type piezoelectric oscillator of the present invention, the case and the stem are coated with the solder containing 90% and higher of lead, the piece of piezoelectric oscillator is fixed by melting the solder coated on the inner lead of the stem, a rectangular case having a thickness within the range from 0.05 to 1.5 mm and whose periphery in the cross-section has one or more corners excepting the lead portion of the pressure seal type piezoelectric oscillator wherein the case and the stem are hermetically sealed with the solder as a shielding material by the pressure seal method is attached. Therefore, an inexpensive piezoelectric oscillator having high quality and sufficient heat resistance, which is further convenient to operate for automatic mounting and the like, can be obtained.

According to the piezoelectric oscillating apparatus of the present invention, the case and the stem are coated with the solder containing 90% and higher of lead and the solder is used as a mounting material of the piece of oscillator and a hermetically shielding material, and the lead of the piezoelectric oscillator is welded as a composition metal layer wherein a metallic lead of the lead frame contains 90% and higher of lead, thereby achieving a piezoelectric oscillating apparatus having 260° C. and higher heat resistance.

In addition, the pressure seal type piezoelectric oscillator and the semiconductor are disposed on either side of the lead frame respectively and they are insulated by pushing out the tab of the lead frame, thereby providing a small-sized piezoelectric oscillator having good heat resistance.

Another embodiment of the present invention is described with reference to FIGS. 18(a)–18(c). The primary difference between this embodiment and the embodiment depicted in FIGS. 14(a) and 14(b) is the positioning of the relative elements within the lead frame. Like structures are indicated by similar reference numerals indicated as prime.

FIG. 18(a) illustrates a resin mold type oscillator after cutting. A lead frame 20' includes suspension leads 51a' and 51b' which support a tab portion 21'. A semiconductor integrated circuit (IC) chip 19' is mounted on tab portion 21'. Lead frame 20' also includes support leads 55a' and 55b'. Connection pads 52a' and 52b' are supported by respective support leads 55a' and 55b'. Lead frame 20' also includes lead frame outer leads 57' disposed on opposed sides of lead frame 20'.

A piezoelectric resonator 18' includes outer leads 53'. Outer leads 53' are bent twice in a plane substantially perependicular to a plane formed by lead frame 20', thus maintaining a clearance X' between outer leads 53' and lead frame 20'. Outer leads 53' contact lead frame 20' at respective connection pads 52a' and 52b'. Resin mold piezoelectric oscillator package 22' encapsulates piezoelectric oscillator 18' and IC chip 19' and portions of lead frame 20'.

As more particularly shown in FIG. 18(b), lead frame outer leads 57' extend from resin mold piezoelectric oscillator package 22'. Lead frame outer leads 57' may be bent in a substantially J-shaped configuration to form electrical contact terminals. The placement of the relative leads and electric components is by way of example only and is not limiting. By way of example, lead frame outer leads 57' need not be disposed on opposed sides in mirror image as shown in FIG. 18(a).

It will thus be seen that the objects set forth above, and those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

What is claimed is:

1. A resin mold type piezoelectric oscillator comprising:
   a piezoelectric resonator including a piezoelectric vibrator and at least one outer lead;
   a semiconductor integrated circuit formed in one chip for electrically oscillating said piezoelectric resonator; and
   a lead frame formed substantially in a plane and having at least one connection pad, the semiconductor integrated circuit and the piezoelectric resonator being mounted on and electrically connected to the lead frame, the at least one outer lead of the piezoelectric resonator being electrically connected to at least one connection pad of the lead frame, and the at least one outer lead of the piezoelectric resonator being bent at least twice in a plane which is substantially perpendicular to the plane of the lead frame and which also intersects the connection pad to which the outer lead is connected.

2. The resin mold type piezoelectric oscillator claim 1, wherein the at least two bends in the at least one outer lead each form an angle of about 10° to about 45°.

3. The resin mold type piezoelectric oscillator of claim 1, wherein the semiconductor integrated circuit and a plane formed along the long axis of the piezoelectric resonator are substantially coplanar in a plane substantially parallel to the plane of the lead frame.

4. The resin mold type piezoelectric oscillator of claim 1, wherein the lead frame has an inner lead and the at least one outer lead of the piezoelectric resonator crosses the inner lead of the lead frame.

5. The resin mold type piezoelectric oscillator of claim 4, wherein the at least two bends of the at least one outer lead provide a clearance between the at least one outer lead and the inner lead of the lead frame.

6. The resin mold type piezoelectric oscillator of claim 5, wherein the clearance between the at least one outer lead and the inner lead of the lead frame is at least the thickness of the lead frame.

7. The resin mold type piezoelectric oscillator of claim 1, further comprising a second outer lead of the piezoelectric resonator and wherein the at least one outer lead and the second outer lead each have a proximal end and a distal end, and the distance between the at least one outer lead and second outer lead at their distal ends is greater than the distance between the at least one outer lead and the second outer lead at their proximal ends.

8. The resin mold type piezoelectric oscillator of claim 7, wherein the difference in the distances between the distal ends of the at least one outer lead and the second outer lead and between the proximal ends of the at least one outer lead and the second outer lead forms an angle between the at least one outer lead and the second outer lead of about 5° to about 15°.

9. A resin mold type piezoelectric oscillator comprising:
   a piezoelectric resonator including a piezoelectric vibrator and at least one outer lead;
   a semiconductor integrated circuit formed in one chip for electrically oscillating said piezoelectric resonator; and
   a lead frame formed substantially in a plane, the lead frame having at least one suspension pin lead, a tab portion supported by the suspension pin leads, support leads, and connection pads supported by the support leads, the semiconductor integrated circuit and the piezoelectric resonator being mounted on and electrically connected to the lead frame, the semiconductor integrated circuit being mounted on the tab portion of the lead frame, and the at least one suspension pin lead and the support leads of the connection pads being arranged along a side of the resin mold type piezoelectric oscillator such that the at least one suspension pin lead and the support leads may be cut at the same time.

10. The resin mold type piezoelectric oscillator of claim 9, wherein the lead frame further comprises at least two lead frame outer leads, and wherein the distance between the at least one suspension pin lead arranged along said side of the piezoelectric oscillator and a first adjacent support lead of the connection pads, and the distance between adjacent support leads, are each greater than or equal to the distance between adjacent lead frame outer leads.

* * * * *